(12) United States Patent
Winkler et al.

(10) Patent No.: US 7,114,402 B2
(45) Date of Patent: Oct. 3, 2006

(54) SENSOR ELEMENT DEVICE FOR A CAPACITIVE CONTACT SWITCH WITH AN ELECTRICALLY CONDUCTIVE BODY AND METHOD FOR THE MANUFACTURE OF SUCH A BODY

(75) Inventors: Uwe Winkler, Ettlingen (DE); Wilfried Schilling, Kraichtal (DE)

(73) Assignee: E.G.O. Elektro-Geraetebau GmbH, (DE)

( * ) Notice: Subject to any disclaimer, the term of this patent is extended or adjusted under 35 U.S.C. 154(b) by 0 days.

(21) Appl. No.: 10/689,139

(22) Filed: Oct. 20, 2003

(65) Prior Publication Data
US 2004/0084970 A1 May 6, 2004

(30) Foreign Application Priority Data
Oct. 31, 2002 (DE) ................ 102 51 639

(51) Int. Cl.
*G01L 1/12* (2006.01)
(52) U.S. Cl. ................ 73/862.626
(58) Field of Classification Search ........... 73/862.626
See application file for complete search history.

(56) References Cited
U.S. PATENT DOCUMENTS

| | | | |
|---|---|---|---|
| 4,380,007 A | 4/1983 | Steinegger | |
| 4,384,299 A * | 5/1983 | Raffel et al. | 257/324 |
| 4,399,321 A * | 8/1983 | Gottlieb | 29/854 |
| 4,896,069 A | 1/1990 | Rosenberg et al. | |
| 5,083,467 A * | 1/1992 | Tabota | 73/862.046 |
| 5,087,825 A | 2/1992 | Ingraham | |
| 5,447,076 A * | 9/1995 | Ziegler | 73/862.626 |
| 5,515,738 A * | 5/1996 | Tamori | 73/862.46 |
| 5,717,565 A | 2/1998 | Raasch | |
| 5,917,165 A | 6/1999 | Platt et al. | |
| 5,973,417 A | 10/1999 | Goetz et al. | |
| 6,265,682 B1 | 7/2001 | Lee | |
| 6,280,207 B1 | 8/2001 | Sakata et al. | |
| 6,657,614 B1 * | 12/2003 | Ito et al. | 345/168 |
| 6,728,113 B1 * | 4/2004 | Knight et al. | 361/760 |
| 6,894,233 B1 * | 5/2005 | Dingwall et al. | 177/210 C |
| 2003/0146447 A1 * | 8/2003 | Sautter et al. | 257/108 |

* cited by examiner

*Primary Examiner*—Max Noori
(74) *Attorney, Agent, or Firm*—Akerman Senterfitt

(57) ABSTRACT

According to an embodiment of the invention, a sensor element device for a capacitive contact switch can be formed from a foam body with several portions. There are electrically conductive areas with a sensor element surface and an electrical contact face, as well as insulating areas. The sensor element surfaces engage from below on a glass ceramic plate. The areas can be interconnected in cylindrically elongated and juxtaposed manner. This leads to a type of strand material from which with the predetermined spacing it is possible to produce juxtaposed, capacitive sensor elements as parts of contact switches.

40 Claims, 2 Drawing Sheets

SENSOR ELEMENT DEVICE FOR A CAPACITIVE CONTACT SWITCH WITH AN ELECTRICALLY CONDUCTIVE BODY AND METHOD FOR THE MANUFACTURE OF SUCH A BODY

FIELD OF APPLICATION AND PRIOR ART

The invention relates to a sensor element device and to a method for the manufacture of a body as a sensor element for a capacitive sensor element device.

Such sensor element devices are known from EP 859 467 B1, where a sensor element with a body is described, which has a roughly elongated and cylindrical or barrel-shape. As is apparent from this prior, art several such bodies are required for juxtaposed sensor elements or the contact switches formed by the latter and which are located on a printed circuit board. The manufacturing method described involves such bodies being cut to length from a long rod by an automatic assembly machine.

PROBLEM AND SOLUTION

The problem of the invention is to provide a sensor element device and a method of the type described hereinbefore, in which the body as the sensor element has a novel construction and extended functionality, whilst the body manufacturing method is simplified.

This problem is solved by a sensor element device having the features of claim 1 and a method having the features of claim 22. Advantageous and preferred developments of the invention form the subject matter of further claims and are described in greater detail hereinafter. By express reference the wording of the claims is made into integral part of the content of the description.

According to the invention, the sensor element device has a three-dimensional shape-variable and elastically compressible body and which is formed as a sensor element. It is electrically conductive and extends at least in one area from an electrical contact zone on the one hand to a sensor element surface on the other. According to the invention it has different areas. There is at least one conductive area extending between an electrical contact zone and a sensor element surface and which is electrically conductive throughout. There is also at least one insulating area, which is not electrically conductive. There is at least one insulating area between several conductive areas. Thus, advantageously conductive areas and insulating areas are juxtaposed in alternating manner. Thus, according to the invention it is possible to create a single, unitary body, which as a single, easily handleable unit forms several sensor elements and therefore several contact switches.

Advantageously the sensor element surface is formed by the surface of part of a conductive area. The sensor element surface can be formed by the contact face between part of a conductive area and a cover on which engages the sensor element device. Consequently there is no need for a separate surface in order to reduce manufacturing costs. This principle is known from EP 859 467 B1 to which reference is expressly made in this connection.

Another advantage is that numerous small bodies are replaced by a single, larger body. In addition, there can be significant simplifications to the assembly processes, because it is no longer necessary to handle and optionally insert or mount several parts and instead this only applies to a single part.

It is apparent, particularly in comparison with the aforementioned EP 859 467 B1, that the single sensor element body, as used up to now, is difficult to handle as a result of its in part small size. However, a larger body according to the invention is easier to handle.

The numerous conductive areas and the at least one insulating area can be mechanically and firmly interconnected. They are advantageously interconnected in such a way that they are so-to-speak non-detachable, i.e. do not automatically come apart and instead this only takes place under force action. In particularly preferred manner they are constructed in one piece.

Advantageously between the electrical contact zone and the sensor element surface, the areas are elongated and extend in this direction. Advantageously all the conductive areas pass in this extension direction, i.e. in a particularly advantageous manner are parallel to one another.

The insulating areas can also run in this extension direction. It is particularly advantageous if the areas are cylindrical with a round or angular cross-section.

The body is advantageously made from a rubbery material in order to have the elastic, compressible characteristics. This can e.g. be a foam and the electrical conductivity is obtained by means of carbon black or metal inclusions. For more precise information concerning this sensor element body, particularly with regards to the manufacture, material characteristics or composition, express reference is made to EP 859 467 B1 and U.S. Pat. No. 5,087,825, whose wording is by express reference made into part of the content of the present description.

The body can be part of a strand and therefore has a very considerable length. The aforementioned extension direction of the areas can be perpendicular to the longitudinal direction of the strand. This means that the strand is constructed in such a way that it has a large number of juxtaposed conductive and insulating areas.

In a fundamental state e.g. after manufacture, said strand can be linear. This with particular advantage relates to its longitudinal direction, so that it is a straight strand. According to an advantageous variant it can be bent in a direction at right angles to the extension direction of the areas and is in particular elastically bendable. This offers the advantage that e.g. arcuately arranged sensor elements can be formed with a single body. For this purpose the body is merely bent in the desired manner, which is easily possible as a result of the elasticity. In the case of fixing to a printed circuit board or the like or behind an operating screen or the like, the bent shape can be fixed, so that e.g. also circular arrangements are possible.

As an alternative to such a bendable strand, the body can already be constructed in a per se predeterminable shape, i.e. in zig-zag form or shapes which can scarcely be produced by bending. This shape can be obtained with particular advantage by the joining together of the individual areas.

The mutual spacings of the areas and in particular their total dimensions such as cross-section and length, are identical at least in the case of some conductive areas. Advantageously all the conductive areas are identical. This more particularly has manufacturing advantages in such a way that from a long rod material it is e.g. possible to separate the conductive areas and to join them together with the insulating areas, which are e.g. produced in the same way, to form a strand-like sensor element.

In addition to an elongated, strand-like construction, the areas can also form a body with a bank-like or areal construction. Thus, different areas, particularly conductive and insulating areas can alternate in both areal extensions of the body and can be joined together. Advantageously the conductive areas are separated from one another in each direction by insulating areas. The resulting body can either form a closed surface or have recesses or openings. It is consequently possible for there to be in the direct link between two mutually closest conductive areas in each case forming sensor elements either an insulating area or an insulating air gap. The body can be constructed in such a way that it can be tailor-made, e.g. using blades or a laser. Alternatively or additionally the body can be separated at a junction point between two areas. This can e.g. take place by pulling or tearing off by hand and without aids. The connection of the areas, which can e.g. be an adhesive joint, can be separated without damaging the individual areas.

The electrical contact zone for the conductive areas advantageously has contacts, which with particular advantage are laminar and constructed as contact banks. Advantageously the contacts have at least the mutual spacing of two conductive areas or even a larger spacing. In a particularly preferred development, between two mutually closest contacts there are several, i.e. for example three or four conductive areas. Thus, there is only direct contacting of those areas which engage with contacts. The intermediate conductive areas have no direct contact.

It is possible for an insulating area between conductive areas to form a dielectric in such a way that between the conductive areas are formed transverse or shunt capacitances and therefore capacitive, electrical connections. In this way there can also be an electrical connection to conductive areas not directly connected to a contact. This can make it possible to require fewer contact zones than conductive areas and therefore there are fewer sensor element surfaces. It is also possible to evaluate these sensor element surfaces by means of the aforementioned transverse capacitances. For this purpose it is necessary to correspondingly design an evaluating circuit, which is connected to the sensor element device and has the contact zones. This is possible due to the fact that the transverse capacitances are known. Thus, from a signal emanating from a contact on one of the conductive areas it is possible to establish by means of the known transverse capacitances at which point the contact took place and therefore which specific signal should be emitted.

A conductive area and in particular the entire body can have an insulating coating or the like on the side directed towards the electrical contact zone. This makes it possible for the electrical contact zone to have elongated and upwardly projecting contact pins. On mounting the body, these push through the insulating coating into the conductive area and thereby bring about electrical contacting. This can make it possible to mount in precisely positioned manner complete strand-like or plate-like bodies on a printed circuit board. The printed circuit board can carry contact pins, which pierce through the insulating coating at precisely predetermined points and produce a desired contacting with individual, conductive areas. Other contacts left open or soldering points on the printed circuit board do not represent an undesired contact zone and in this way prevent malfunctioning.

A conductive area is advantageously adjacently enveloped by one or more insulating areas and is advantageously completely surrounded by the insulating areas.

In the aforementioned method according to the invention for the manufacture of a sensor element body conductive areas are formed, e.g. in the aforementioned manner. They are made from electrically conductive, three-dimensional shape-variable, elastically compressible material. These conductive areas are linked by insulating areas, in the manner described hereinbefore, made from three-dimensional shape-variable, elastically compressible, insulating material. Thus, such areas can e.g. be lined up in juxtaposed manner as cylinder-like pins or the like. Joining can take place by adhesion and this mainly applies to a material-linking connection. This can e.g. be heat sealing or thermal welding.

Far more conductive and insulating areas can be produced in juxtaformed manner as bodies in strand form than are required for a sensor element device. Through the separation of individual bodies finishing takes place so that they are available in the requisite form.

The above and further features can be gathered from the claims, description and drawings and the individual features, both singly and in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

Embodiments of the invention are described in greater detail hereinafter relative to the diagrammatic drawings, wherein show.

DETAILED DESCRIPTION OF EMBODIMENTS

Figure 1:
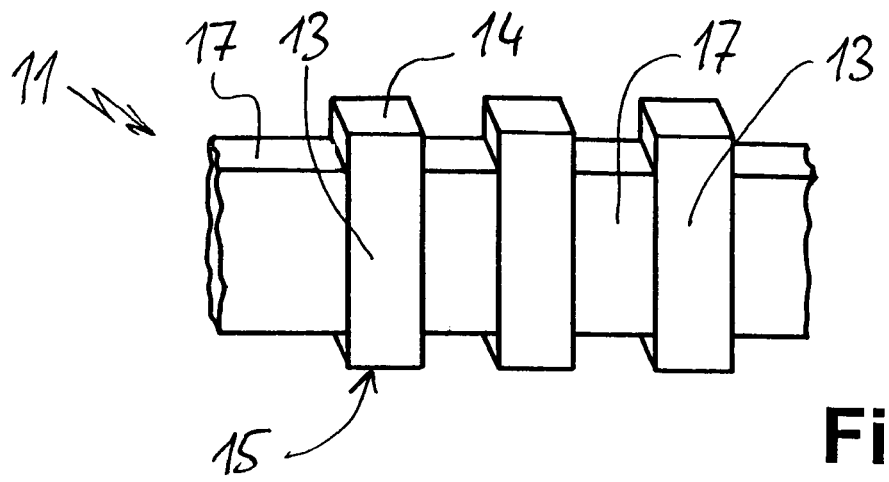
FIG. 1 A basic representation of the arrangement possibilities for juxtaposed conductive and insulating areas.

FIG. 1 shows a strand-like sensor element device 11 or part thereof. The sensor element device 11 comprises elongated, quadrangular, cylindrical, conductive areas 13 having at one end a sensor element surface 14, at the top in FIG. 1. An electrical contact face is provided on the downwardly directed surface and with this electrical contacting can take place on a circuit or the like. In this form the conductive area 13 roughly corresponds to an elastic sensor element of the type described hereinbefore. This more particularly also applies to the function of the sensor element surface 14 and the electrical contact face 15.

The sensor element device 11 has several such conductive areas 13, which in the embodiment shown are substantially identical and parallel to one another, being connected by insulating areas 17. In each case between two conductive areas 13 an insulating area 17 is provided. This leads to a type of stringing together of areas 13 and 17. In particular as a result of the mechanical connection producing the sensor element device 11 as a single component, easy handling and installation is possible.

As stated hereinbefore, for forming such a sensor element device 11 it is possible to separately manufacture and then interconnect the areas 13 and 17. Alternatively a type of intermediate expansion operation would be possible. Either the conductive areas 13 or the insulating areas 17 can be moulded in between the in each case areas of the other type using a two-component injection moulding process such as is known in plastics processing.

It is finally also possible from a single, per se homogeneous piece of starting material through working individual areas to subsequently make them either electrically conductive or electrically insulating. Possibilities would e.g. be offered by thermal or chemical working or irradiation.

As can be gathered from FIG. 1 and also as a general observation, it is advantageous for the sensor element surface 14 and/or the electrical contact faces 15 to all be in one plane. This simplifies manufacture as a standardized strand material and also facilitates use. In certain circumstances it is alternatively advantageous to provide different lengths of conductive areas 13 or insulating areas 17.

Figure 2:
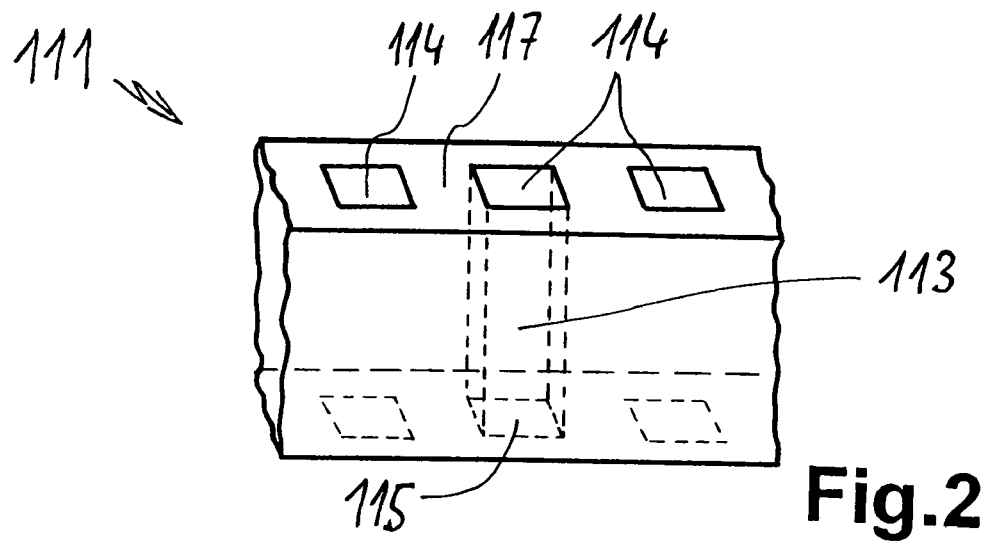
FIGS. 2 to 4 Constructions of strand-like sensor element bodies in straight or curved form, where the electrically conductive areas are surrounded by insulating areas.

FIG. 2 shows a variant of a sensor element device 111, which once again has conductive, cylindrical, elongated areas 113. In FIG. 2 they are provided at the top with a sensor element surface 114 and at the bottom with an electrical contact face 115.

Differing from the construction according to FIG. 1 the conductive areas 113 are surrounded by material 117, except in the areas where the sensor element surfaces 14 and electrical contact faces 115 are located. The material 117 forms the insulating areas 117 and is located not only between two conductive areas 113, but also on the sides thereof. This avoids undesired lateral contacting of the conductive areas 113. In addition, as a result of the greater width of the strand-like sensor element device, there can in certain circumstances be an easier assembly or installation. Finally, in certain circumstances shields or the like can be produced in this way, e.g. as an additional coating furthest to the outside on the sides of the insulating material 117.

Figure 3:
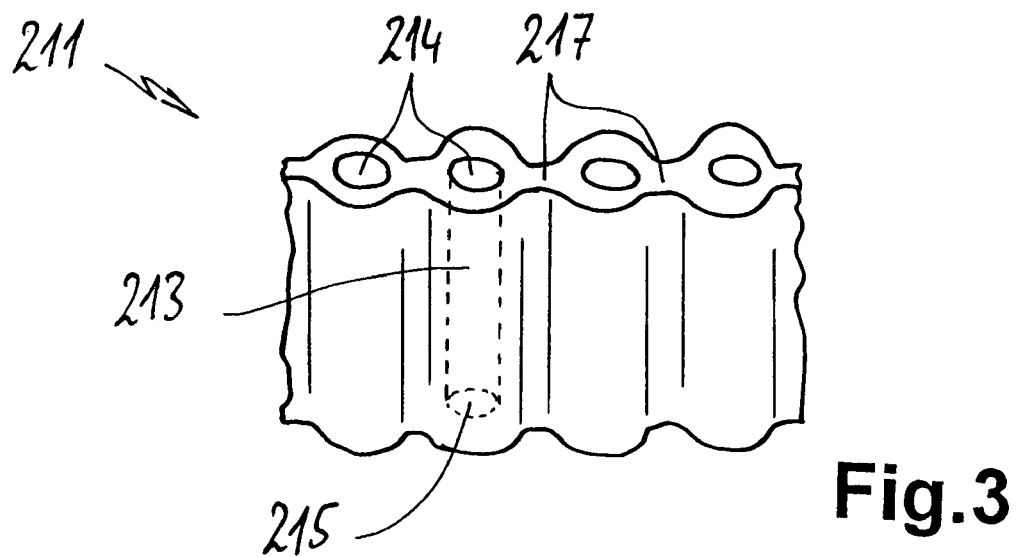

FIG. 3 once again shows a strand-like sensor element device 211 roughly corresponding to that of FIG. 2. Once again there are conductive areas 213 which are laterally completely surrounded by insulating material. The latter forms the insulating areas 217, which inter alia are located between in each case two conductive areas 213.

According to FIG. 2 the sensor element surfaces 214 and electrical contact faces 215 are left free. Simple assistance is available if this leaving free of the surfaces 214 and 215 preferably in one plane proves to be difficult from the manufacturing standpoint and when it cannot be brought about in a precise manner. This advantageously involves a sensor element device being cut flat in order to create identical, planar surfaces 214, 215 over which the insulating material does not project.

Figure 4:
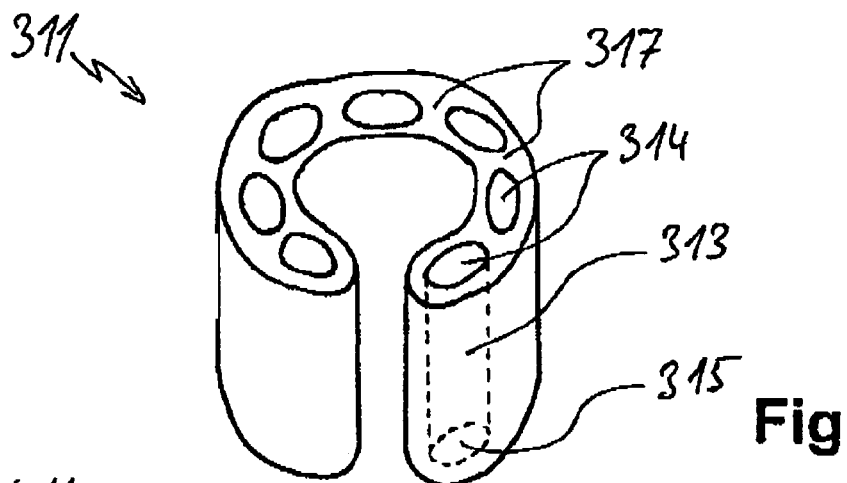

FIG. 4 shows a further construction of a sensor element device 311 in strand form and which roughly corresponds to that of FIG. 2. It is bent in circular manner and its ends almost abut with one another. Such a sensor element device 311 can be produced either by corresponding shaping of a straight strand material according to FIG. 2 or the bent shape can be constructed in self-maintaining manner, which permits easier installation.

The conductive areas 313 and consequently also the sensor element surface 314 and electrical contact face 315 here have an elongated oval shape. However, this is unimportant and is essentially variable. As in FIG. 2 insulating areas 317 are located between the conducting areas.

It is also possible to diverge from the elongated and/or cylindrical shape of the conductive areas or insulating areas shown in the drawings. For example, the surfaces 14 and 15 can be made larger than the remainder of the conductive areas in cross-section form. Alternatively the surfaces can be smaller than the cross-sections. This depends on which surfaces are desired with respect to the sensor element sensitivity or release on the one hand and which cross-sections with respect to the electrical conductivity or other electrical properties on the other.

It is also clear that the sensor element device 311 of FIG. 4 could also have a closed construction in the manner of a circular ring, i.e. the front gap can be closed. This is readily apparent to the expert from FIG. 4 and is easy to technically achieve.

Figure 5:
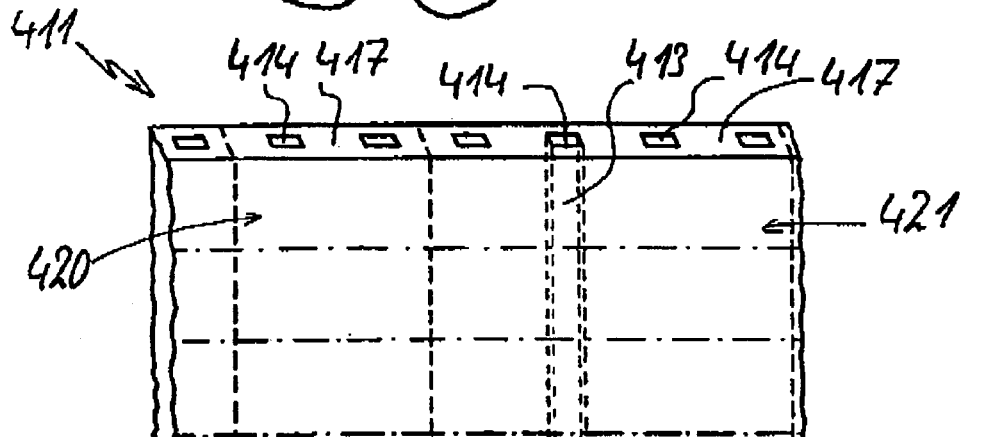
FIG. 5 A starting form for the production of a sensor element body in laminar form from which individual sensor element bodies can be produced by transverse and longitudinal cutting.

FIG. 5 shows a sensor element device 411 constructed in the manner of a plate. Parallel to the extension surface of the device are located conductive areas 413 with sensor element surfaces 414 and electrical contact faces 415. Much as in FIG. 2, there are completely surrounding insulations in the form of the insulating material 417.

The plate-like sensor element device 411 according to FIG. 5 can now be split by cutting into elongated, strand-like sensor element devices corresponding to FIG. 2. It is possible to cut or separate in accordance with the dot-dash lines. These dot-dash lines are perpendicular to the longitudinal extension of the conductive areas 413. The thus obtained strand-like sensor element devices can then be cut to length in accordance with the broken lines. The embodiment of FIG. 5 provides for a subdivision into blocks of two (420) and four (421), i.e. with in each case two or four conductive areas 413.

A construction of a sensor element device 411 according to FIG. 5 has the major advantage that it can be manufactured substantially automatically or even fully automatically using plastics processing plants. Through corresponding cutting, separating or dimensioning it is possible to produce the desired, individual sensor element devices.

Figure 6:
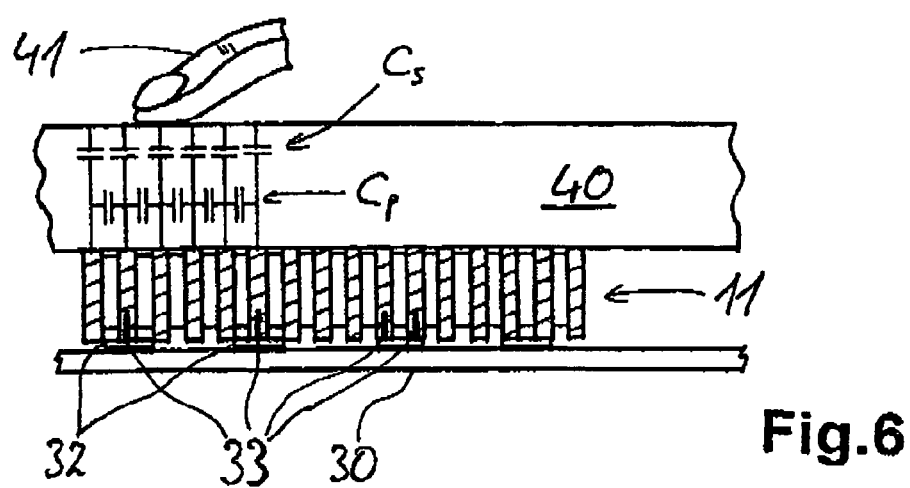
FIG. 6 A sensor element body in cross-section, where there are several conductive areas between the electrical contact zones.

The embodiment illustrated in FIG. 6 shows how a sensor element device 11 like that of FIG. 1 can be used. Besides not shown electronics and further components, a printed circuit board 30 caries contact banks 32, which can e.g. be built up from the conducting tracks. Upwardly projecting contact pins 33 may be provided, in order to produce electrical contact between the contact banks 32 and the conducting areas.

The printed circuit board 30 runs in parallel and at a certain distance from an underside of a glass ceramic plate 40. Between them is provided the sensor element device 11 in such a way that it comes to rest with the electrical contact faces 15 in part on contact banks 32. The sensor element surfaces 14 are located on the underside of the glass ceramic plate 40. It must be borne in mind that between the individual contact banks 32 individual conductive areas 13 and also with respect to their contact faces 15 can so-to-speak dangle in the air, so that no electrical contacting occurs here.

As shown in FIG. 6 by means of the glass ceramic plate 40 as dielectric serial capacitances Cs are built up towards the top. If a finger 41 contacts the top of the glass ceramic plate 40 above a conductive area 13 or its sensor element surface 14 a per se known capacitive coupling occurs. By means of a corresponding evaluating circuit, which is not described in detail here, it can be evaluated as an operation or actuation.

In FIG. 6, in addition to the serial capacitances Cs, which are in each case formed above a conductive area 13, there are parallel capacitances Cp, which in each case are located between two adjacent, conductive areas 13. They are formed through the electrical characteristics of the insulating areas 17 located between the electrically conductive areas 13. By means of said parallel capacitances Cp there is also an electrical connection of conductive areas 13, which are not directly contacted by means of their electrical contact face 15. It is consequently possible to reduce the number of contact banks 32 or even make this number smaller than that for the conductive areas 13. A localization of finger application can take place through the evaluation of the known, corresponding transverse capacitances Cp, which is merely a matter of the evaluating circuit.

By means of such a device it is possible with an acceptable expenditure to provide several sensor element surfaces along a line corresponding e.g. to a scale or gradation. Contacting effort and expenditure can be correspondingly reduced.

The invention claimed is:

1. A sensor element device for a capacitive contact switch, said sensor element device comprising a three-dimensional shape-variable, elastic, compressible body,
   wherein said body is at least zonally electrically conductive,
   wherein said sensor element device has an electrical contact zone for contact to a control and a sensor element surface,
   wherein said body extends from said electrical contact zone to said sensor element surface and has different areas,
   wherein one of said areas is a conductive area being electrically conductive throughout between said electrical contact zone and said sensor element surface, and another of said areas is an insulating area not being electrically conductive,
   wherein there is at least one said insulating area between several of said conductive areas; and
   wherein an insulating area forms a dielectric between two of said conductive areas in such a way that transverse capacitances or capacitive connections are formed between the said conductive areas.

2. Sensor element device according to claim 1, wherein said sensor element surface is formed by a surface of part of one of said conductive areas.

3. Sensor element device according to claim 2, wherein said sensor element device engages with a cover, wherein said sensor element surface is formed by a contact face between part of said conductive area and said cover.

4. Sensor element device according to claim 1, wherein said conductive areas and said at least one insulating area are mechanically interconnected.

5. Sensor element device according to claim 4, wherein said conductive areas are in one piece.

6. Sensor element device according to claim 1, wherein in an extension direction from said electrical contact zone to said sensor element surface said conductive areas run in roughly said same extension direction.

7. Sensor element device according to claim 6, wherein all said areas of said sensor element including said insulating areas run in said same extension direction.

8. Sensor element device according to claim 6, wherein said areas, considered in said extension direction, are elongated and have a longer extension in said extension direction than in another direction at right angles thereto.

9. Sensor element device according to claim 1, wherein said body is made from a rubbery material.

10. Sensor element device according to claim 9, wherein said rubbery material is made conductive with inclusions.

11. Sensor element device according to claim 1, wherein said body is part of a strand, an extension direction of said areas being perpendicular to a longitudinal direction of said strand.

12. Sensor element device according to claim 11, wherein said strand in a basic state, in said longitudinal direction, is linear and is bendable in a direction at right angles to an extension direction of said areas.

13. Sensor element device according to claim 1, wherein said conductive areas are separated from one another in each direction.

14. Sensor element device according to claim 1, wherein in a direct connection between two mutually closest of said conductive areas is provided an insulating area or an air gap.

15. Sensor element device according to claim 1, wherein said body is cuttable or separable to size at junction points of two said areas.

16. Sensor element device according to claim 1, wherein said electrical contact zone has contacts and said contacts at least have a mutual spacing of two said conductive areas.

17. Sensor element device according to claim 16, wherein several of said conductive areas are located between two mutually closest contacts.

18. Sensor element device according to claim 1, wherein one of said conductive areas is provided on a side directed towards said electrical contact zone with an insulating coating, said electrical contact zone having elongated and upwardly projecting contact pins pushing through said insulating coating in said conductive area in order to produce said electrical contact zone.

19. Sensor element device according to claim 1, wherein one if said conductive areas is completely enveloped by one or more insulating areas in a lateral direction at right angles to its extension direction.

20. A sensor element device for a capacitive contact switch, the sensor element device comprising a three-dimensional shape-variable, elastic, compressible body,
   wherein said body is at least zonally electrically conductive,
   wherein said sensor element device has an electrical contact zone for contact to a control and a sensor element surface,
   wherein said body extends from said electrical contact zone to said sensor element surface and has different areas,
   wherein one of said areas is a conductive area being electrically conductive throughout between said electrical contact zone and said sensor element surface, and another of said areas is an insulating area not being electrically conductive,
   wherein there is at least one said insulating area between several of said conductive areas, and
   wherein a sensor element surface is located on the underside of a non-flexible and electrically isolating plate.

21. Sensor element device according to claim 20, wherein said sensor element surface is formed by a surface of part of one of said conductive areas.

22. Sensor element device according to claim 20, wherein said sensor element device engages with a cover, wherein said sensor element surface is formed by a contact face between part of said conductive area and said cover.

23. Sensor element device according to claim 20, wherein said conductive areas and said at least one insulating area are mechanically interconnected.

24. Sensor element device according to claim 20, wherein said conductive areas are in one piece.

25. Sensor element device according to claim 20, wherein in an extension direction from said electrical contact zone to said sensor element surface said conductive areas run in roughly said same extension direction.

26. Sensor element device according to claim 20, wherein all said areas of said sensor element including said insulating areas run in said same extension direction.

27. Sensor element device according to claim 20, wherein said areas, considered in said extension direction, are elongated and have a longer extension in said extension direction than in another direction at right angles thereto.

28. Sensor element device according to claim 20, wherein said body is made from a rubbery material.

29. Sensor element device according to claim 20, wherein said rubbery material is made conductive with inclusions.

30. Sensor element device according to claim 20, wherein said body is part of a strand, an extension direction of said areas being perpendicular to a longitudinal direction of said strand.

31. Sensor element device according to claim 20, wherein said strand in a basic state, in said longitudinal direction, is linear and is bendable in a direction at right angles to an extension direction of said areas.

32. Sensor element device according to claim 20, wherein said conductive areas are separated from one another in each direction.

33. Sensor element device according to claim 20, wherein in a direct connection between two mutually closest of said conductive areas is provided an insulating area or an air gap.

34. Sensor element device according to claim 20, wherein said body is cuttable or separable to size at junction points of two said areas.

35. Sensor element device according to claim 20, wherein said electrical contact zone has contacts and said contacts at least have a mutual spacing of two said conductive areas.

36. Sensor element device according to claim 20, wherein several of said conductive areas are located between two mutually closest contacts.

37. Sensor element device according to claim 20, wherein one of said conductive areas is provided on a side directed towards said electrical contact zone with an insulating coating, said electrical contact zone having elongated and upwardly projecting contact pins pushing through said insulating coating in said conductive area in order to produce said electrical contact zone.

38. Sensor element device according to claim 20, wherein an insulating area forms a dielectric between two of said conductive areas in such a way that transverse capacitances or capacitive connections are formed between the said conductive areas.

39. Sensor element device according to claim 20, wherein one if said conductive areas is completely enveloped by one or more insulating areas in a lateral direction at right angles to its extension direction.

40. A sensor element device for a capacitive contact switch, the sensor element device comprising a three-dimensional shape-variable, elastic, compressible body,
   wherein said body is at least zonally electrically conductive,
   wherein said sensor element device has an electrical contact zone for contact to a control and a sensor element surface,
   wherein said body extends from said electrical contact zone to said sensor element surface and has different areas,
   wherein one of said areas is a conductive area being electrically conductive throughout between said electrical contact zone and said sensor element surface, and another of said areas is an insulating area not being electrically conductive,
   wherein there is at least one said insulating area between several of said conductive areas, and
   wherein one of said conductive areas is provided on a side directed towards said electrical contact zone with an insulating coating, said electrical contact zone having elongated and upwardly projecting contact pins pushing through said insulating coating in said conductive area in order to produce said electrical contact zone.

* * * * *